United States Patent [19]

McHugh et al.

[11] Patent Number: 5,236,367
[45] Date of Patent: Aug. 17, 1993

[54] ELECTRICAL SOCKET CONNECTOR WITH MANUAL RETAINER AND ENHANCED CONTACT COUPLING

[75] Inventors: Robert G. McHugh, Pleasanton; Conrad Choy, San Francisco, both of Calif.

[73] Assignee: Foxconn International, Inc., Sunnyvale, Calif.

[21] Appl. No.: 843,428

[22] Filed: Feb. 28, 1992

[51] Int. Cl.⁵ .............................................. H01R 9/09
[52] U.S. Cl. ..................................... 439/73; 439/331; 439/525
[58] Field of Search ...................... 439/70, 71, 72, 73, 439/330, 331, 525, 526, 862

[56] References Cited

U.S. PATENT DOCUMENTS

| | | | |
|---|---|---|---|
| 4,268,102 | 5/1981 | Grabbe | 439/70 X |
| 4,349,238 | 9/1982 | Showman et al. | 439/70 X |
| 4,547,031 | 10/1985 | Korsunsky et al. | |
| 4,632,485 | 12/1986 | Brown et al. | 439/70 X |
| 4,758,176 | 7/1987 | Abe et al. | |
| 4,826,440 | 5/1989 | Plocek et al. | 439/70 |
| 4,872,845 | 10/1989 | Korsunsky et al. | |
| 4,936,783 | 6/1990 | Petersen | 439/72 X |
| 4,968,259 | 11/1990 | Korsunsky et al. | |
| 4,969,828 | 11/1990 | Bright et al. | |
| 5,000,696 | 3/1991 | Matsuoka et al. | |
| 5,067,904 | 11/1991 | Takeuchi et al. | 439/73 |

*Primary Examiner*—Larry I. Schwartz
*Assistant Examiner*—Khiem Nguyen
*Attorney, Agent, or Firm*—Flehr, Hohbach, Test, Albritton & Herbert

[57] ABSTRACT

An electrical connector with manual retainer and enhanced contact coupling is provided which comprises: an insulative mounting socket (30) including a base portion (35), slots (38) formed on the top face of the base portion, a wall (31) upstanding from the top of the base portion, and indents (33) formed on the bottom face (39) of the base portion; a retainer (10) including a main surface (11) sized to fit over the electrical component (20) received in the mounting socket, at least a first and a second stuffer (12) depending downward from the main surface and sized to fit against the leads (22) received in the slots; at least a first and a second latch mechanism each including at least one fulcrum (12) coupled to the stuffer, a lever bar (17) coupled to the fulcrum, at least one leg (14) depending downward from the lever bar, a latch protrusion (16) coupled to the leg and formed to extend on the outside of the wall such that the first latch protrusion physically contacts with the indents when the retainer is aligned on the mounting socket; a plurality of conductive contacts (50) mounted inside the base portion such that the contacts extend through the top face and the bottom face of the base portion, such contacts including a horizontal beam 53, a vertical beam (54), a grip mechanism (52), a first resilient (55) and second resilient (56) portion and portion (57).

17 Claims, 6 Drawing Sheets

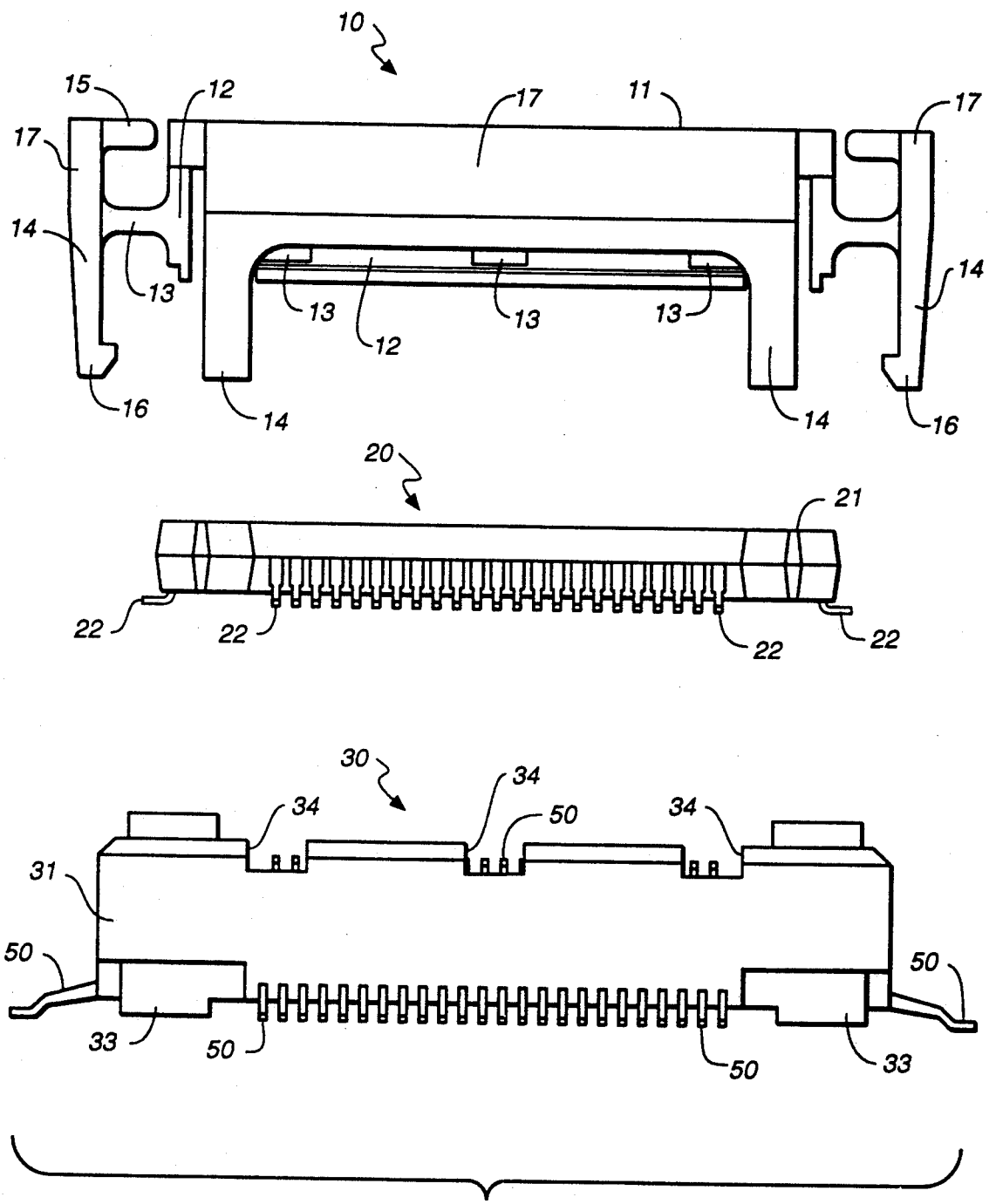
FIG._1

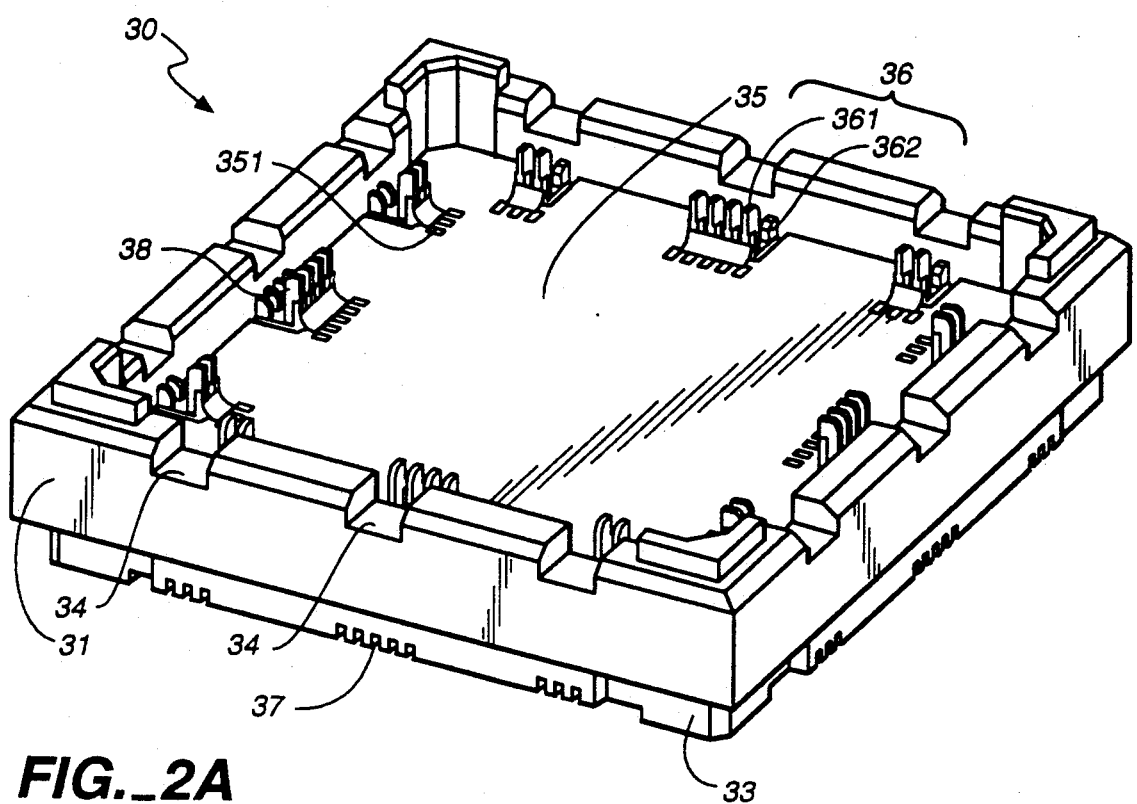
FIG._2A
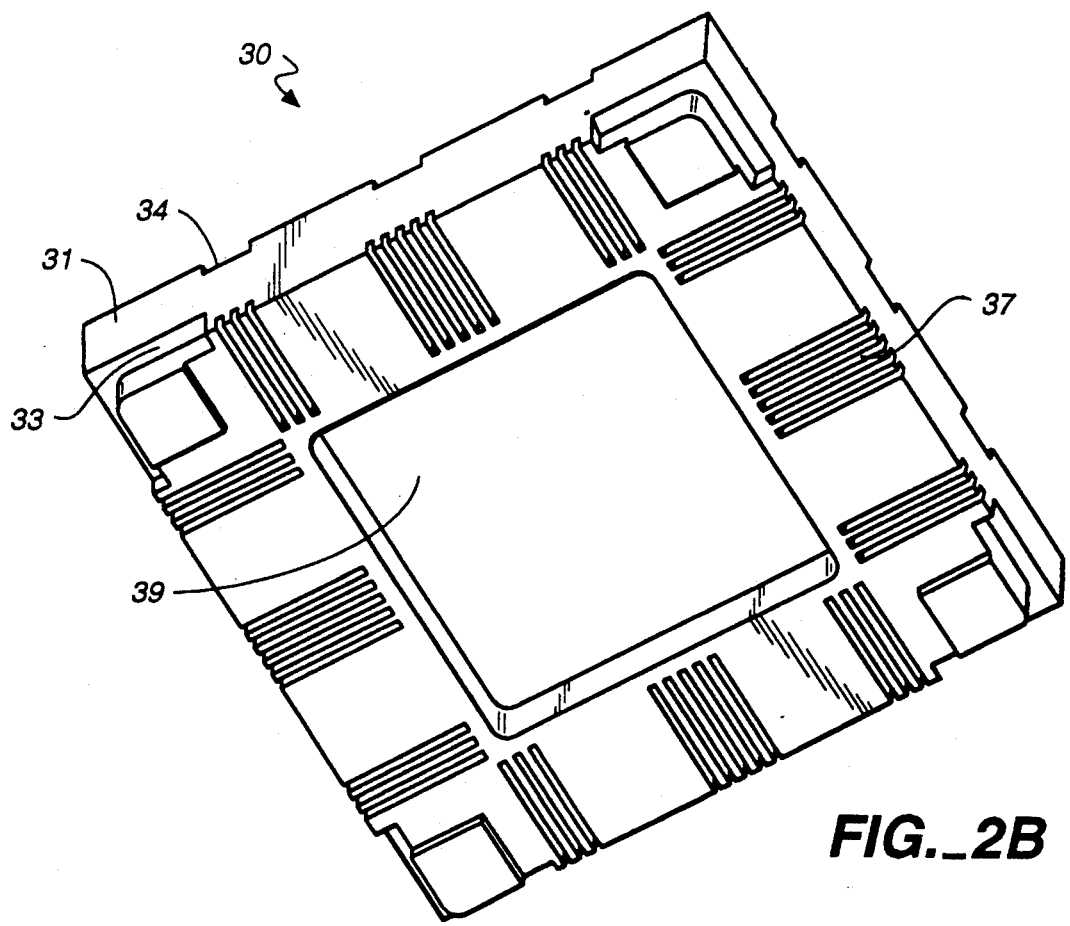
FIG._2B

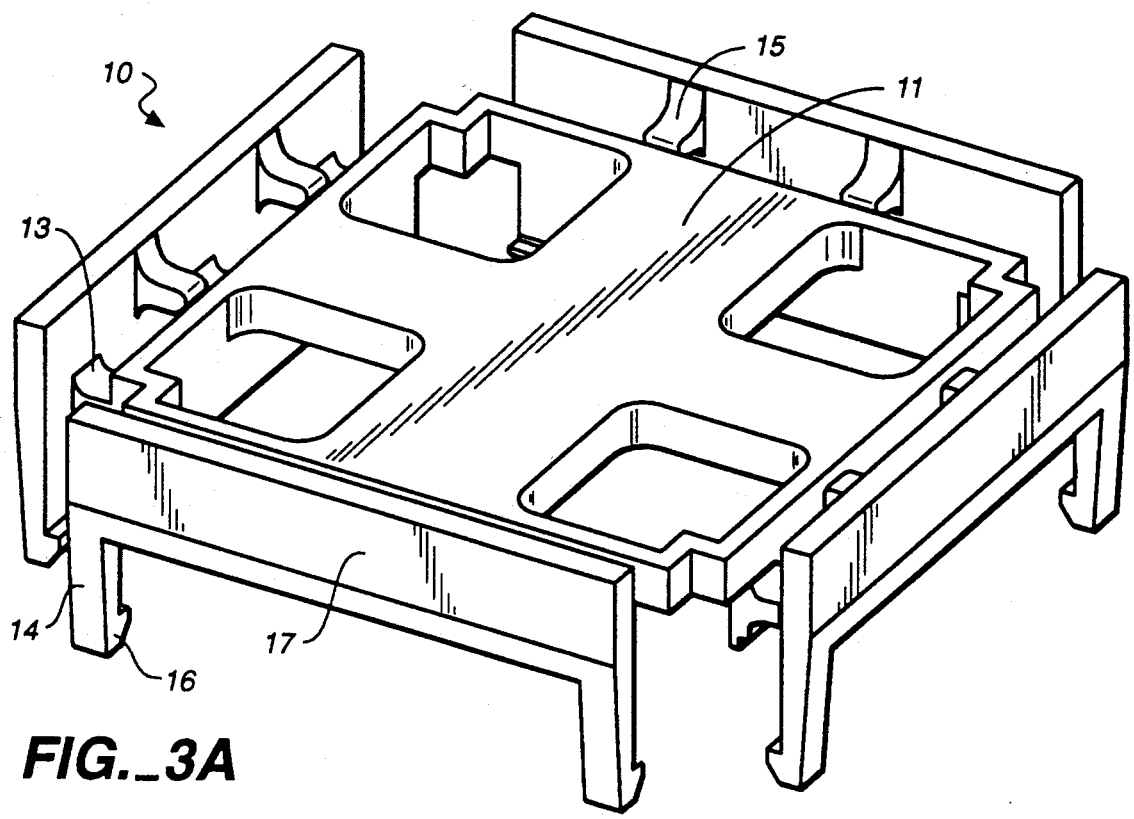
FIG._3A
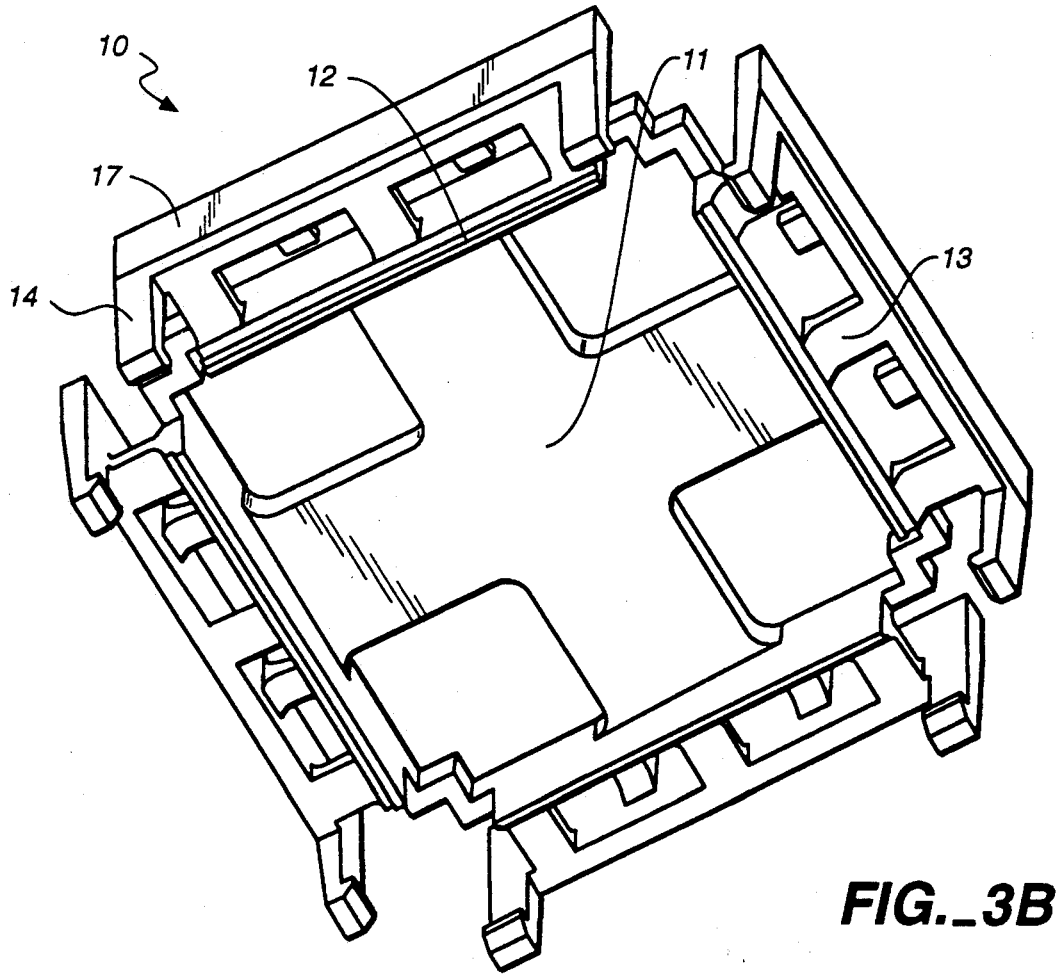
FIG._3B

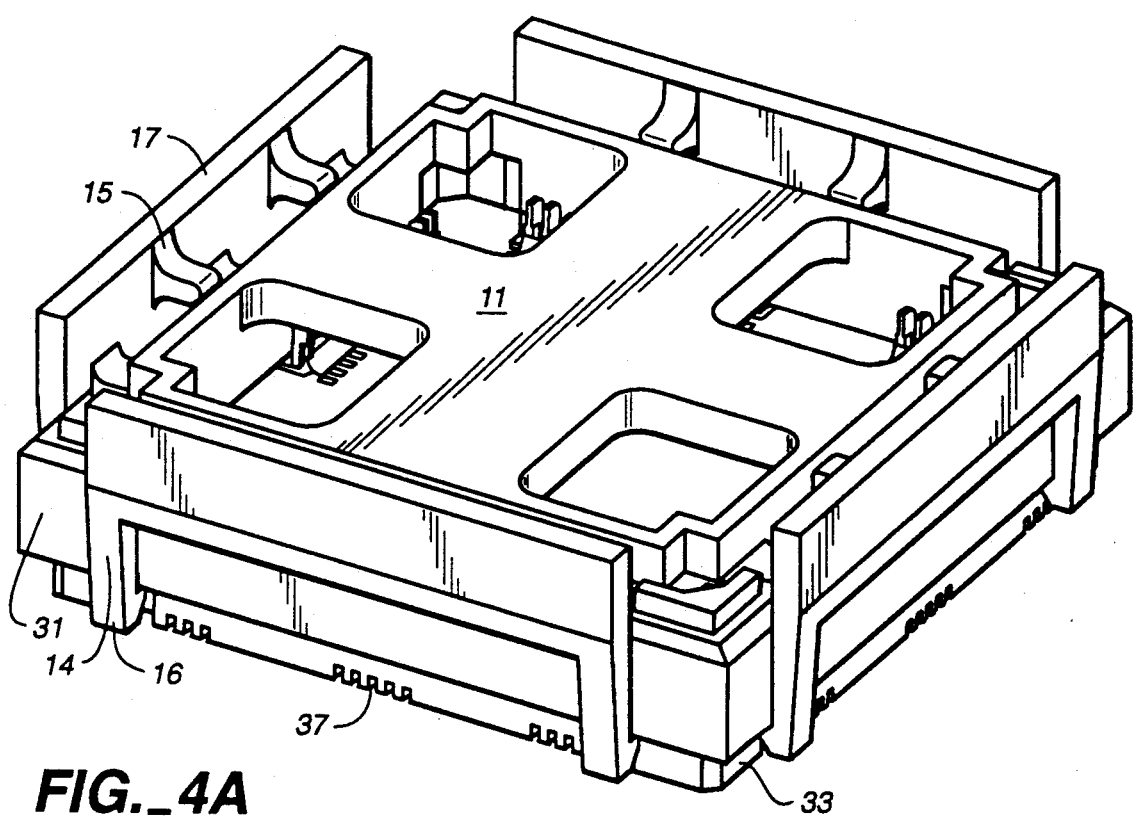
FIG._4A
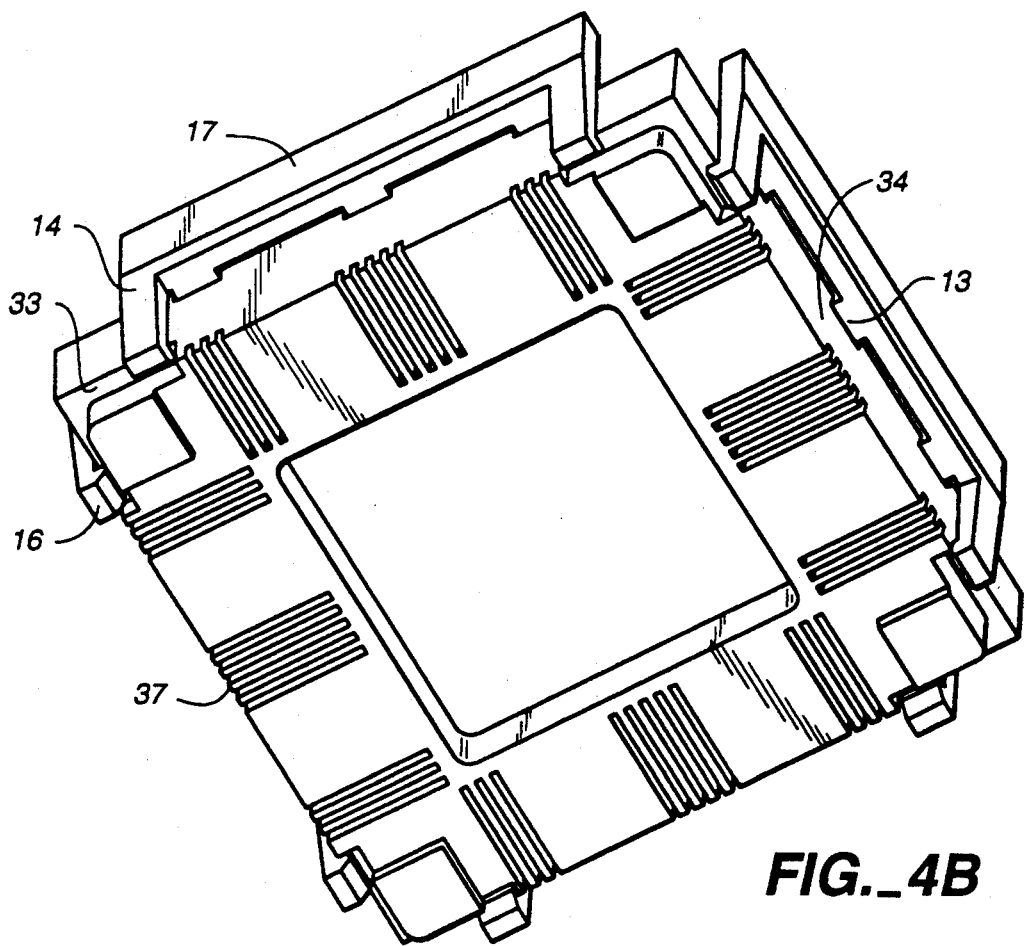
FIG._4B

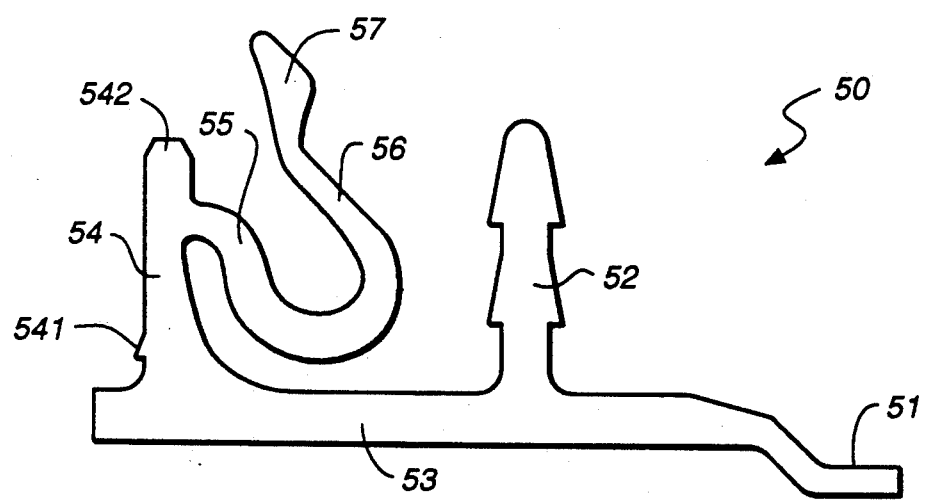
FIG._5A
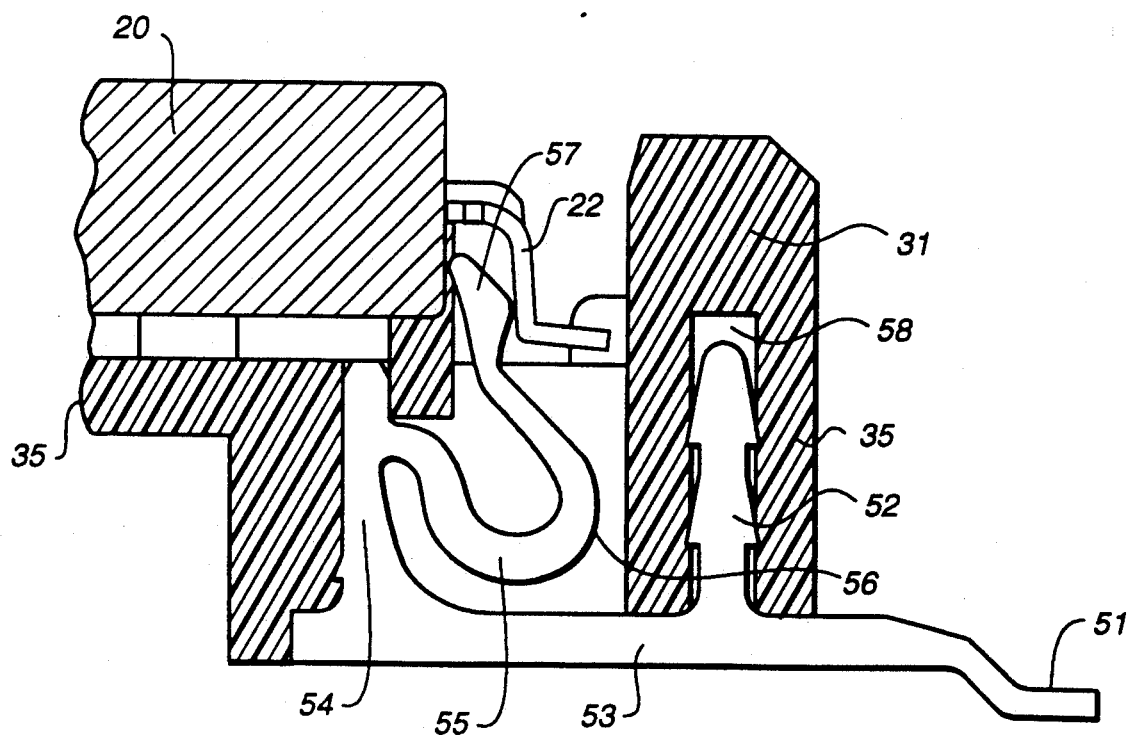
FIG._5B

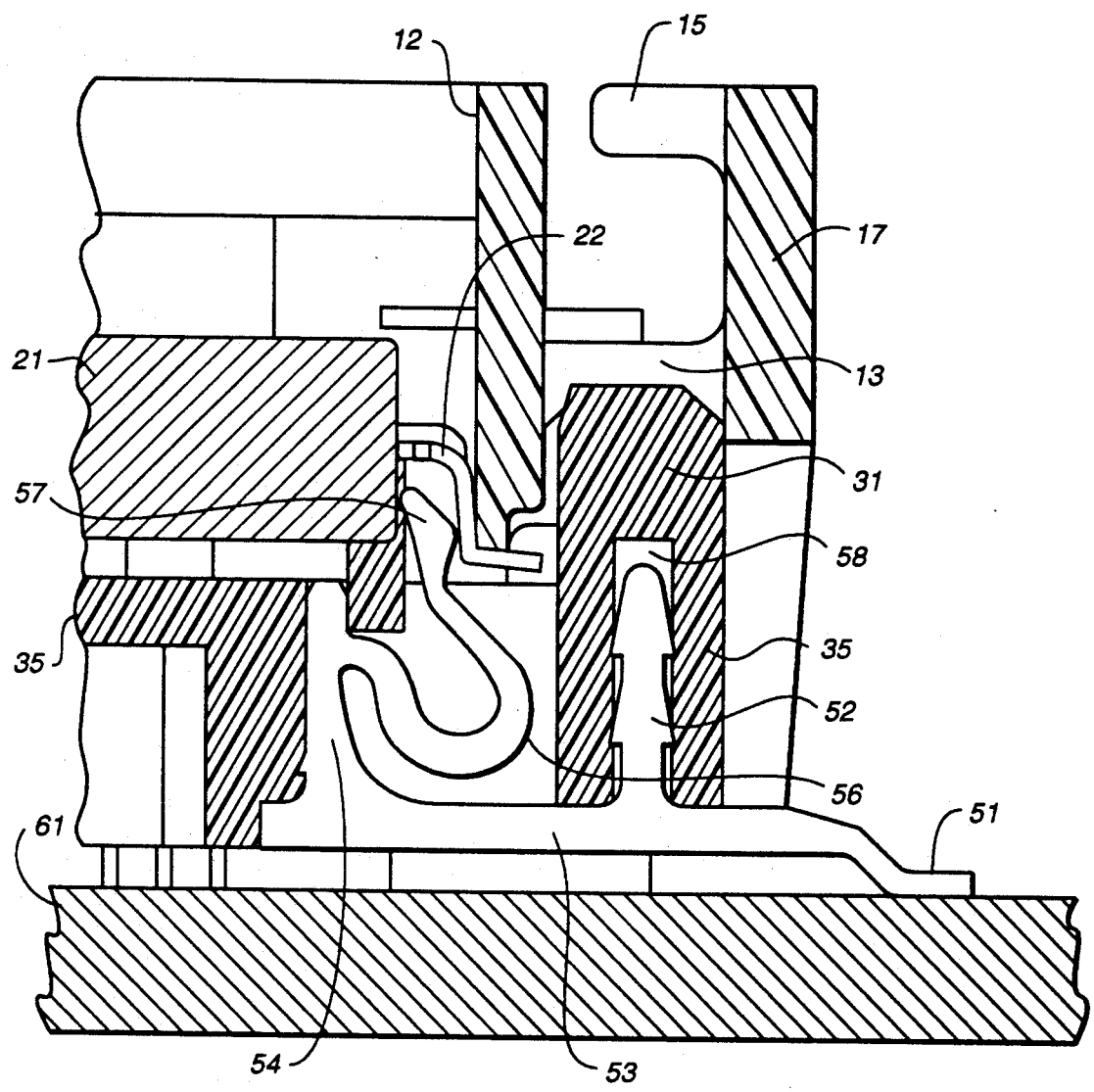
FIG._6

ELECTRICAL SOCKET CONNECTOR WITH MANUAL RETAINER AND ENHANCED CONTACT COUPLING

BACKGROUND OF THE INVENTION

1. Field of the Invention

This invention relates to electrical integrated circuit chip sockets in general and, more particularly, to electrical integrated circuit chip sockets with manual retainers and enhanced contact coupling.

2. Description of the Related Art

Integrated circuit chip packages typically comprise a package body and conductive leads. The package body itself is insulative and houses the internal electronics of the chip. Generally, the conductive leads emanate from all four sides of the package body. The leads provide the electrical connectivity to the internal workings of the chip.

To electrically connect the integrated circuit to the rest of the system, a separate electrical socket is often provided. Typically, an electrical socket comprises an mounting socket, a retainer, and a latch mechanism. The mounting socket provides a insulative base portion that receives the chip package. The base portion contains a plurality of conductive contacts that protrude from the top and bottom faces of the mounting socket. The bottom portions of the contacts electrically mate the socket to the rest of the system and are generally soldered to a printed circuit board.

The top portions of the contacts electrically mate the chip package to the socket. The contacts protruding from the top face are generally formed to correspond to the leads that emanate from the chip package. To mate the chip package to the socket, the chip package must be aligned so that the leads and the contacts correspond. The package is then set down in the insulative base portion such that the leads physically touch the contacts.

After the package is mounted in the socket, a retainer is coupled over the package to the mounting socket. The retainer provides a degree of protection to the chip package against accidental contact and damage. While many earlier sockets provide a retainer, the mating and de-mating of the retainer to the socket occasionally requires special tools. There are earlier sockets that can be mated and de-mated manually. The retainers of those earlier sockets are usually hinged to one side of the socket. Thus, most earlier retainers cannot be completely de-mated from the socket.

Another desirable feature provided by some sockets is a mechanism that can enhance the electrical coupling of the chip package leads to the socket contacts. Several approaches have been tried. First, a stuffer can be added to the retainer that forces the package leads against the socket contacts. A second attempt involves designing the contact itself to provide an optimum physical coupling between the lead and the contact when the chip package is mounted on the socket. No socket has yet provided the various advantages of a completely removable manual retainer as well as a mechanism for enhancing the coupling of the leads to the contacts simultaneously.

Thus, there has been a need for an improved socket with a retainer that can be manually mated and de-mated and can also provided enhanced electrical coupling of the chip package to the contacts of the electrical socket. There has also been a need for a socket with an improved contact that enhances the physical coupling between the lead and the contact when the chip package is mounted on the socket.

SUMMARY OF THE INVENTION

A present embodiment of the present invention comprises an insulative mounting socket, an insulative retainer, and at least a first and second latch mechanism for securing the retainer to the mounting socket. The mounting socket includes a base portion, a wall substantially surrounding the base portion, a plurality of conductive contacts protruding from both the top and the bottom of the base portion, and indents formed on the bottom of the base portion.

The retainer includes a main surface, at least two stuffers depending downward from opposite sides of the main surface. The first and second latch mechanisms depend from the first and second stuffers respectively. The first and second latch mechanisms include at least one fulcrum depending perpendicularly outward from the first and second stuffer respectively. A lever bar perpendicularly depends upward from the fulcrum. At least one leg depends downward from the lever bar. A latch protrusion is formed on the end of the leg. In another aspect, the present invention comprises a plurality of conductive contacts, each contact including: a horizontal beam, a vertical beam depending upward from said horizontal beam, a first resilient curved portion depending outward and downward from said vertical beam, a second resilient curved portion depending upward from said first resilient curved portion such that both first and second resilient portion define a "U"-shaped curve, a contact portion depending from said second resilient curved portion, and a barb depending from the end of said contact portion.

The present invention improves upon the mating and de-mating of the retainer to the mounting socket. The retainer of the present invention is fully removable and can be manually mated and de-mated by applying finger pressure to the opposing lever bars. The lever bars of the present invention are located on the top of the retainer for easy manual access. The ease of access is advantageous when several of these sockets are crowded on a printed circuit board. By placing the lever bars on the top of the retainer, instead of the bottom near the printed circuit board, manual finger pressure is facilitated.

The present invention simultaneously provides enhanced physical and electrical coupling between the leads of the chip package and the contacts of the mounting socket. This enhanced coupling is provided in two ways. First, when the retainer is coupled to the socket, the stuffers abut against the leads of the chip package which, in turn, abut against the contacts of the socket. This abutment prevents the leads from physically decoupling from the contacts.

Second, the contacts of the present invention are designed to enhance the physical coupling of the leads to the contacts when the chip package is initially mounted in the socket. The contacts of the present invention define two resilient portions that deform when the leads are pushed down on top of the contacts. This deformation produces a tension between the leads and the contacts such that the leads are forced partially upward and away from the chip package. As discussed below, this tension enhances the physical coupling of the leads to the contacts.

These and other features and advantages of the present invention will become more apparent from the following description of exemplary embodiments thereof, as illustrated in the accompanying drawings.

BRIEF DESCRIPTION OF THE DRAWINGS

FIG. 1 is an exploded perspective view of the components that comprise the electrical socket assembly in accordance with the present invention.

FIGS. 2A-2B are a top perspective and a bottom perspective view respectively of the insulative mounting socket.

FIGS. 3A-3B are a top perspective and a bottom perspective view respectively of the retainer.

FIGS. 4A-4B are a top perspective and a bottom perspective view respectively of the retainer as coupled to the insulative mounting socket in the presently preferred embodiment of the present invention.

FIG. 5A is a side view of an individual conductive contact as defined in the presently preferred embodiment of the present invention.

FIG. 5B is a side, sectional view of the mounting socket contact and the chip package lead make as the integrated circuit chip package is mounted into the insulative mounting socket.

FIG. 6 is a side sectional view of the electrical socket assembly after the chip package and the retainer are mounted on the insulative mounting socket in the presently preferred embodiment of the present invention.

DETAILED DESCRIPTION OF THE PREFERRED EMBODIMENT

The present invention provides an electrical socket with a manual retainer and enhanced contact coupling. The following description is presented to enable any person skilled in the art to make and use the invention, and is provided in the context of a particular application and its requirements. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiment shown, but is to be accorded with the widest scope consistent with the principles and features disclosed herein.

Referring to FIG. 1, there is shown an exploded perspective view of the components of a presently preferred embodiment of an electrical socket in accordance with the present invention. The electrical socket comprises a retainer 10 and an insulative mounting socket 30. A separate integrated circuit chip package 20 is shown in relative alignment prior to assembly.

The chip package 20 includes an insulative housing assembly 21 which houses the internal integrated circuitry. In the presently preferred embodiment, the housing assembly 21 is square in shape. Providing electrical interconnectivity to the circuitry, conductive leads 22 protrude downward and away from the four sides of the housing assembly 21.

It will be appreciated that the chip package 21 is not a part of the presently claimed invention; but is housed and electrically connected to the electrical socket which is claimed. Accordingly, the particular shape or structure of the chip package 21 as shown in FIG. 1 should not be construed as a limitation on the presently claimed invention. Chip packages of other sizes and shapes may be accommodated by the presently preferred embodiment of the present invention or an equivalent structure thereof.

FIGS. 2A-2B show a top perspective and a bottom perspective respectively of the insulative mounting socket, without the contacts installed. In the presently preferred embodiment, the insulative mounting socket 30 comprises a rectangular-shaped base portion that includes a top face 35 and a bottom face 39. The top face 35 defines the receiving area for the chip package 21. A wall 31 upstands from and surrounds the four sides of the top face 35 of the base portion. Alignment slots 34 are formed along the entire circumference of the wall 31.

Rising perpendicularly from the top face 35 of the base portion are insulative rib protrusions 36. The rib protrusions 36 are formed on each of the four sides of the mounting socket in the presently preferred embodiment. The rib protrusions 36 are formed such that each rib protrusion 36 consists of a smaller portion 362 formed adjacent to the wall 31 and a taller portion 361 formed more in the interior of the top face 35. Each rib protrusion 36 borders a contact portion 57 of an individual contact 50 (not shown in FIG. 2A) and serves to separate adjacent contact portions 57 of contacts 50. Thus, the rib protrusions 36 give the contact portions 57 of the contacts 50 stability during repeated matings and de-matings of chip packages 20 as well as provides electrical isolation between the individual contact portions 57 of the contacts 50.

Additionally, the taller portion 361 and the smaller portion 362 of the rib protrusions 38 form four slots 38, one per side of the top face 35 of the base portion, into which the leads 21 of the chip package 20 and the stuffers 12 of the retainer 10 fit. The slots 38 are parallel and adjacent to the walls 31.

Cavities 37 are formed in the insulative mounting socket 30. The cavities 37 extend through the top face 35 (not shown in FIG. 2A) and the bottom face 39 of the base portion (as shown in FIG. 2B). Each cavity 37 corresponds to exactly one conductive contact 50 (as shown in FIG. 5B). As the contacts are installed in the mounting socket 30, the bottom portion 51 of the contact protrudes from the bottom face 39 and the contact portion 57 of the contact protrudes from the top face 35 (as shown in FIGS. 1, 5B, and 6). The individual cavities 37 provide stability and electrical isolation for the individual contacts 50.

Indents 33 are formed on the bottom sides of the bottom face 39 of the base portion. As will be discussed below, the indents 33 allow the retainer 10 to physically couple to the mounting socket 30.

The shape of the insulative mounting socket 30 is rectangular in the preferred embodiment, and contacts 50 protrude from each of the four faces of the socket in the presently preferred embodiment. It will be appreciated, however, that the rectangular shape of the socket is not a necessary feature of the presently claimed invention. For example, the shape could be a square, any regular polygon, or various other shapes in order to properly practice the principles of the present invention. Additionally, it will be appreciated that it is not necessary that the contacts emanate from all the sides of the socket in order to properly practice the present invention.

Referring to FIGS. 1 and 3A-3B, the retainer 10 is fitted snugly over the insulative mounting socket 30 after the chip package 20 is mounted in the socket 30. The retainer 10 serves to prevent any outside contact with the chip package 20 and, at the same time, provides enhanced physical and electrical coupling between the leads 22 of the chip package 20 and the contact portion 57 of contacts.

In the presently preferred embodiment, the retainer 5 comprises a square-shaped main surface 11 consisting of two connecting crosspieces and a surrounding edge, as shown in FIGS. 3A and 3B. Four stuffers 12 (one per each side of the main surface 11) depend downward from main surface 11. Depending from each of the four stuffers 12 are latch mechanisms that couple the retainer 10 to the mounting socket 30.

Each latch mechanism in the presently preferred embodiment comprises three fulcrums 13 that are formed integrally formed on each stuffer 12. A lever bar 17 integrally formed with the three fulcrums 13. The lever bar 17 is formed above the three fulcrums 13. Two legs 14 are integrally formed and depend downward from the lever bar 17. The two legs 14 extend below the three fulcrums 13. With the lever bar 17 above the fulcrums 13 and the legs 14 below the fulcrums 13, the lever bar 17 together with the fulcrums 13 and the legs 14 act properly as a lever. A latch protrusion 16 integrally formed on the end of each leg 14 which physically engages the socket 30, as will be explained below.

It will be appreciated that the use of four stuffers, one per each side of the main surface 11, as well as the use of three fulcrums 13 and two legs 14 per latch mechanism is not necessary to practice the present invention. It is sufficient to have two latch mechanisms on opposite sides of the main surface 11 to properly practice the present invention. Additionally, it is sufficient for each latch mechanism to have only one fulcrum as well as only one leg to practice the present invention.

Now the mounting of the chip package 20 and the operation of the retainer 10 will be described in detail. To mount the chip package 21 into the base portion 35, the chip package is aligned such that the leads 22 are facing down towards the top face 35 of the base portion, with the sides of both the package 21 and the top face 35 of the base portion parallel. The chip package 21 is then set down into the top face 35 of the base portion until each individual lead 21 is in physical contact with the contact portion 57 of an individual contact 50 (not shown in FIGS. 2A-2B, but shown in FIG. 6).

After the chip package 20 is mounted in the mounting socket 30, the retainer 10 is coupled to the mounting socket 30. Alignment slots 34 and indents 33 are used to physically couple the retainer 10 to the mounting socket 30. The retainer 10 is aligned over the mounting socket 30 such that the sides of the retainer 10 are parallel to the sides of the mounting socket 30 and the legs 14 are pointed towards the mounting socket 30. In this alignment, the fulcrums 13 of the retainer 10 are aligned to fit into the alignment slots 34 that are formed on the wall 31 of the mounting socket 30. The alignment slots 34 provide enhanced physical coupling of the retainer 10 to the mounting socket 30.

When the retainer 10 is pushed down over the mounting socket 10, the legs 14 of the retainer 10 move along the outside of the wall 31 of the mounting socket 30. As the legs 14 move, they are slightly pushed outward by the wall 31; thus creating an inward tension between the legs 14 and the wall 31. This movement continues until the fulcrums 13 are extended fully through the alignment slots 34 and abut against the wall 31. In this position, the legs 14 are fully extended down against the wall 31 and the latch protrusions 16 clear the indents 33 that are formed at the bottom of the wall 31. Upon clearing the indents 33, the latch protrusions 16 snap inward against the indents 33, thereby latching the retainer 10 to the mounting socket 30. This latching mechanism is better viewed in FIG. 4B.

Another consequence of the retainer 10 being latched on the mounting socket 30 is that the stuffers 12 of the retainer 10 are maximally extended through the slots 38 formed by the taller portion 361 and the smaller portion 362 of the rib protrusions 36. In this position, the stuffers 12 abut against the leads 22 of the chip package 20, thus enhancing the physical coupling between the leads 22 and the contact portions 57 of the contacts.

FIGS. 3A and 3B show in greater detail the presently preferred embodiment of the retainer 10. It will be appreciated that the mating and de-mating of the retainer 10 to the mounting surface 30 requires no special tools and that only slight finger pressure upon the lever bars 17 is required. By lightly applying an inward pressure to the lever bars 17 on opposing sides of the socket 30, each lever bar 17 moves inwardly toward the stuffer 12. Because the legs 14 are integrally formed on the lever bar 17, torque is applied to the legs 14. Because the legs 14 depend below the fulcrum 13 whereas the lever bar depends above the fulcrum 13, this torque causes the legs 14 to move outwardly from the stuffers 13. Consequently, this outward motion allows the latch protrusions 16 to clear the indents 33 and allows the retainer 10 to be slipped off the mounting socket 30.

Stops 15 are used to protect the lever bars 17 from being over-stressed upon mating and de-mating. As finger pressure is applied, the lever bar 17 flexes inward until the stops 15 make contact with the stuffers 12. Beyond this point, the lever bar 17 cannot be flexed. The relative alignment of the stops 15 to the stuffers 12 is better viewed in FIGS. 1 and 6.

FIGS. 4A and 4B give a top and bottom perspective view of the retainer 10 mounted on the mounting socket 30. From the bottom view of FIG. 4B, it is clearly demonstrated how the latch protrusions 16 clear and latch onto the indents 33 of the mounting socket 30.

Now it will be explained in greater detail the structure of the conductive contacts 50 and how the chip package 20 is coupled to the mounting surface 30. FIG. 5A shows in detail the structure of the individual contacts 50. The contact 50 comprises a bottom portion 51 which protrudes from the base of the mounting surface 30. This bottom portion 51 depends from a horizontal beam 53. A grip mechanism 52 depends upwards from the horizontal beam 53 and extends through a grip opening 58 (shown in FIG. 5B) in the base portion 35 of the mounting socket 30. Once extended through, the grip mechanism provides the physical coupling of the contact to the mounting socket 30.

A vertical beam 54 depends upward from the horizontal beam 51. The vertical beam 54 aids the grip mechanism with a separate barb 541 formed on the vertical beam 54 and with the top portion 542 of the vertical beam. The barb 541 physically couples to the base portion while the top portion 542 of the contact 50 fits in a corresponding hole 351 formed in base portion and extends through the top side 35 of the base portion.

The vertical beam 54 also provides the support for a first resilient portion 55 of the contact. This first resilient portion 55 is a curved structure that, together with vertical beam 54, forms a first downward depending "U"-shaped structure. A second resilient portion 56 of the contact is contiguous with the first resilient portion 55 and, together with first resilient portion 55, forms a second upward depending "U"-shaped structure. The contact portion 57 of the contact 50 depends from the second resilient portion 56 and is the part that makes physical contact with the lead 22. The contact portion 57 is formed as a barb structure to improve such physical contact with the lead 22.

FIG. 5B demonstrates the action made by the contact portion 57 of the contact as the lead 22 is lowered down on the contact portion 57 of the contact. As the chip package 20 is lowered onto the top face 35 of the base portion of the mounting socket 30, the individual leads 22 make contact with the individual contact portions 57 of the contacts. As the chip package 20 is further lowered, the lead 22 forces the contact portion 57 of the contact down and towards the vertical beam 54. This deformation is made possible by the first 55 and the second 56 resilient portions of the contact. The first resilient portion 55 and second resilient portion 56 act as resilient springs that apply a slightly upward and outward force against the individual lead 22. The outward component of this force helps retain the individual leads 22 in place. The resulting shape of the contact when the chip package 20 is mounted and the retainer 10 is coupled to the mounting socket 30 is demonstrated in FIG. 6.

FIG. 6 shows the relationship between the lead 22, the contact portion 57 of the contact and the stuffer 12 when finally assembled. It is clearly demonstrated that the stuffer 12 abuts against the lead 22 and provides an enhanced physical and electrical coupling between the lead 22 and the contact portion 57 of the contact. Electrical connectivity between the mounting socket and a printed circuit board 61 is provided by the bottom portion 51 of the contact which can be soldered to the circuit board 61.

While a particular embodiment of the invention has been described in detail, it will be understood that the invention may be implemented through alternative embodiments. Thus, the scope of the invention is not intended to be limited to the embodiment described above, but is to be defined by the appended claims.

What is claimed is:

1. An electrical connector for receiving an integrated circuit electrical component including a plurality of leads protruding from the body of said component, the connector comprising:

an insulative mounting socket including a base portion, a top face and a bottom face, said socket defining a plurality of cavities that extend through said base portion from said top face to said bottom face, said socket further including at least a first and a second wall upstanding from opposing sides of said top face, said top face includes a plurality of insulative rib protrusions extending perpendicular from the plane of said top face such that each rib protrusion includes a smaller portion adjacent to said walls and a taller portion formed on the interior of said top face such that said smaller portion and said taller portion defines a slot, each slot being aligned with a respective wall and each slot being disposed adjacent to a respective wall, said top face sized to receive said body of said component, and indents formed on said bottom side;

a plurality of conductive contacts received within said cavities, said contacts extending above said top face of said base portion within said slot such that said contacts and the leads of said component abut when the component is received in said top face, and said contacts extending downwardly through said bottom face, a retainer including a main surface sized to fit over said socket and over said electrical component received in said mounting socket, at least a first stuffer and a second stuffer depending downward from said main surface and sized to be received within said slots when said retainer is fitted over said socket;

a first latch mechanism including at least one first fulcrum formed integrally with said first stuffer, a first lever bar formed integrally with and extending above said first fulcrum, said first lever bar spaced away from said first stuffer by said first fulcrum such that said first wall fits therebetween, at least one first leg formed integrally and depending downward from said first lever bar, said first leg extending below said fulcrum, a first latch protrusion formed integrally with said first leg and formed to engage with at least one of said indents when said retainer is aligned on said mounting socket;

a second latch mechanism including at least one second fulcrum formed integrally with said second stuffer, a second lever bar formed integrally with and extending above said second fulcrum, said second lever bar spaced away from said second stuffer by said second fulcrum such that said second wall fits therebetween, at least one second leg formed integrally and depending downward from said second lever bar, said second leg extending below said fulcrum, a second latch protrusion formed integrally with said second leg and formed to extend on the outside of said wall such that said second latch protrusion physically couples with said indents when said retainer is aligned on said mounting socket.

2. An electrical socket assembly as defined in claim 1 wherein, said first lever bar and said second lever bar include at least one stop such that said stop abuts against said first stuffer and second stuffer when said first lever bar and said second lever bar are depressed a pre-defined amount and prevents said first lever bar and said second lever bar from moving beyond said pre-defined amount.

3. An electrical socket assembly as defined in claim 1 wherein, said first wall and said second wall define at least a first alignment slot and a second alignment slot respectively, each alignment slot sized to receive said first fulcrum and said second fulcrum when said retainer is mounted on said mounting socket.

4. An electrical socket assembly as defined in claim 1 wherein, each said rib protrusion borders at least one said contact.

5. An electrical socket assembly as defined in claim 1 wherein, said first lever bar and said second lever bar include at least one stop such that said stop abuts against said first stuffer and second stuffer when said first lever bar and said second lever bar are depressed a pre-defined amount and prevents said first lever bar and said second lever bar from moving beyond said pre-defined amount; and said first wall and said second wall define at least a first alignment slot and a second alignment slot respectively, each alignment slot sized to receive said first fulcrum and said second fulcrum when said retainer is mounted on said mounting socket.

6. An electrical socket assembly as defined in claim 1 wherein,
said first lever bar and said second lever bar include at least one stop such that said stop abuts against said first stuffer and second stuffer when said first lever bar and said second lever bar are depressed a pre-defined amount and prevents said first lever bar and said second lever bar from moving beyond said pre-defined amount;
said first wall and said second wall define at least a first alignment slot and a second alignment slot respectively, each alignment slot sized to receive said first fulcrum and said second fulcrum when said retainer is mounted on said mounting socket; and
each said rib protrusion borders at least one said contact.

7. An insulative mounting socket for housing an electrical component including a plurality of leads protruding from the body of said component, said mounting socket comprising:
a plurality of conductive contacts such that each contact includes,
a substantially horizontal beam,
a substantially vertical beam depending upward from said horizontal beam and having a top portion protrusion,
a first resilient curved portion depending downward and outward from said vertical beam, below said top portion protrusion, such that said vertical beam and said first resilient curved portion define a first downward depending substantially "U"-shaped curve,
a second resilient curved position depending upward from said first resilient curved position such that said first resilient curved portion and said second resilient curved portion define a second upward depending substantially "U"-shaped curve,
a contact portion depending from said second resilient curved portion;
an insulative mounting socket body defining a plurality of cavities such that each cavity is sized to receive one said contact, each said cavity including a support hole formed an dimensioned for snug sliding receipt of the top portion protrusion of said one contact.

8. An insulative mounting socket as defined in claim 7 wherein,
said conductive contact further includes a grip mechanism spaced-apart from said vertical beam and depending upward from said horizontal beam;
said insulative mounting socket body further includes a grip opening sized to snugly receive said grip mechanism.

9. An electrical connector for receiving an integrated circuit electrical component including a plurality of leads protruding from the body of said component, the connector comprising:
an insulative mounting socket including a base and a pair of walls upstanding from opposite sides of said base and defining a recess therebetween formed for operable receipt of said component;
a plurality of conductive contacts positioned proximate said recess for electrically mating with said leads;
a retainer including a main surface sized to fit over said socket and over said component, said retainer including a first and a second fulcrum depending outward from and on opposite sides of said main surface, each fulcrum having a lever bar depending upward therefrom, a leg portion depending downward therefrom, and a latch mechanism depending from said leg portion, said fulcrum, said lever bar and said leg portion cooperating to resiliently displace said latch mechanism from a locked position, locking said retainer to said socket, and a manually moved released position, releasing said retaining from said socket; and
alignment slots provided in said walls and formed and dimensioned to receive said corresponding fulcrum therein for alignment of said retainer relative said socket.

10. The connector as defined in claim 9 wherein,
a stop depending from the lever such that said stop limits the movement of the lever.

11. The connector as defined in claim 9 wherein,
an indent is positioned on a lower portion of the socket to engage with the latch of the retainer.

12. The connector as defined in claim 9 wherein,
the retainer further includes a stuffer inserted into a contact slot defined on the socket to make a better contact between the leads of the integrated circuit and the contact of the socket.

13. The connector as defined in claim 12 wherein,
said contact slot is formed by an array of ribs, every adjacent two of which border and insulate an individual contact therebetween.

14. A contact of an insulative mounting socket for housing an electrical component including a plurality of leads protruding from the body of said component, said mounting socket including a cavity having cavity walls, said contact comprising:
a substantially horizontal beam,
a grip mechanism depending upward from said horizontal beam and including at least one outwardly extending grip barb;
a substantially vertical beam spaced-apart from the grip mechanism and depending upward from said horizontal beam, said vertical beam including a beam barb extending away from said grip mechanism;
a first resilient curved portion depending downward from said vertical beam toward the horizontal beam and the grip mechanism;
a second resilient curved position depending upward from said first resilient curved portion; and
a contact portion depending from said second resilient curved portion;
said grip barb and said beam barb each engaging said cavity walls of said mounting socket and cooperating with one another in a manner causing lateral stability to said vertical beam.

15. The contact as defined in claim 14 wherein,
the grip mechanism has at least a pair of outwardly extending grip barbs laterally positioned on opposite sides thereof.

16. The contact as defined in claim 15 wherein,
a bottom portion depends from and is aligned with said horizontal beam.

17. An insulative mounting socket as defined in claim 8 wherein,
said vertical beam includes a beam barb extending away from said first resilient curved portion, and said grip mechanism includes at least one outwardly extending grip barb.

* * * * *